United States Patent
Baumgartl et al.

(10) Patent No.: US 8,402,300 B2
(45) Date of Patent: Mar. 19, 2013

(54) SYNCHRONIZATION OF CLOCKS IN AUTONOMOUS COMPONENTS OF AN MR SYSTEM AND SYNCHRONOUS EXECUTION OF COMMANDS IN THOSE COMPONENTS

(75) Inventors: Rudi Baumgartl, Erlangen (DE); Nikolaus Demharter, Dormitz (DE); Georg Pirkl, Dormitz (DE); Roland Werner, Langensendelbach (DE)

(73) Assignee: Siemens Aktiengesellschaft, Munich (DE)

( * ) Notice: Subject to any disclaimer, the term of this patent is extended or adjusted under 35 U.S.C. 154(b) by 293 days.

(21) Appl. No.: 12/849,952

(22) Filed: Aug. 4, 2010

(65) Prior Publication Data
US 2011/0040997 A1 Feb. 17, 2011

(30) Foreign Application Priority Data
Aug. 11, 2009 (DE) .......................... 10 2009 036 936

(51) Int. Cl.
*G06F 1/12* (2006.01)
*G01V 3/18* (2006.01)

(52) U.S. Cl. .......................... 713/400; 713/401; 324/322

(58) Field of Classification Search .......... 713/400–401; 324/322
See application file for complete search history.

(56) References Cited

U.S. PATENT DOCUMENTS

| 7,477,057 B2 | 1/2009 | Baumgartl et al. |
| 7,598,737 B2 | 10/2009 | Campagna |
| 2007/0258479 A1 * | 11/2007 | Baumgartl et al. ........... 370/463 |
| 2008/0122443 A1 * | 5/2008 | Fontius et al. ................. 324/322 |
| 2008/0136417 A1 * | 6/2008 | Baumgartl et al. ........... 324/322 |

* cited by examiner

*Primary Examiner* — Brian Misiura
(74) *Attorney, Agent, or Firm* — Schiff Hardin LLP

(57) ABSTRACT

In a device and a method to execute commands in components of an imaging system, in particular of a magnetic resonance tomography system, local clocks in the components are temporally synchronized, commands, including a respective command execution time specification which respectively specifies at which point in time a command should be executed, are sent to the components, the commands are received by the components, commands and command execution time specifications that are received by components are stored in these components, and a stored command is respectively executed when a time indicated by the local clock coincides with the stored command execution time specification regarding the command.

36 Claims, 6 Drawing Sheets

SYNCHRONIZATION OF CLOCKS IN AUTONOMOUS COMPONENTS OF AN MR SYSTEM AND SYNCHRONOUS EXECUTION OF COMMANDS IN THOSE COMPONENTS

BACKGROUND OF THE INVENTION

1. Field of the Invention

The present invention concerns methods and devices to execute commands in components of an imaging system, and an imaging system, in particular a magnetic resonance tomography apparatus.

2. Description of the Prior Art

Magnetic resonance tomography apparatuses are known from DE 10 2005 052 564, for example.

Modern magnetic resonance systems operate with coils to emit radio-frequency pulses for nuclear magnetic resonance excitation and to receive induced magnetic resonance signals. A magnetic resonance system typically has a permanent magnet or a superconducting coil to generate a basic magnetic field (H0) that is optimally homogeneous in an examination region, a large coil known as a whole-body coil, (also called a body coil or BC) that is normally permanently installed in the MR apparatus, and multiple small local coils (also called surface coils or LCs). To obtain information from which images of a patient can be generated, selected regions of the subject to or, respectively, patient be examined are read out with independently controllable, magnetically orthogonal gradient coils for three axes (for example X, Y approximately radial to the patient, Z in the longitudinal direction of the patient).

Spatially separate components of a magnetic tomography system conventionally have been connected via a number of dedicated control signals (for example "RF_ON") via optical waveguide connections, for example. These control signals are defined based on a central system clock of a central controller (for example 10 MHz). When these control signals are generated or decoded in clock domains that are faster than this system clock, a rigid relationship with the system clock is established by synchronization.

Due to a spatial separation and a simplified scaling capability of the components, it is complicated to conduct the multiple control signals in a base system that are required for the maximum expansion. A new structure of an MR with an optical PCI express bus has been considered. However, the problem arises that now the data and commands to the components controlled via the PCI Express bus arrive at different and variable times. Commands should be executed with extreme precision. The revolution of a spin (360°) in a 3T system is ($1/123$ MHz=) 8 ns. However, the required phase lock characteristic of the commands must be significantly better so that the same phase conditions (between transmission system and reception system) can be reproducibly achieved.

SUMMARY OF THE INVENTION

An object of the present invention is to synchronize components of an imaging system with one another and with a central controller.

This object is achieved in accordance with the invention by an imaging system with multiple components, that include a local clock, an input for commands, including a respective command execution time specification, a memory for commands received via the input, an input for a time synchronization signal, and a control to execute the commands given agreement of a time indicated by the local clock with the command execution time specification (that defines the point in time of the desired execution of the command).

According to an embodiment of the invention, the transmission of commands ensues (in star topology) from a central controller to every component without a detour through other components, in particular via conductors of identical length to each component (even if the spatial distance of the components from the central controller is different).

According to a further embodiment of the invention, the commands are transferred from a central controller to the components via a ring structure (in particular a structure in which a component is connected with two additional components), in particular in that at least two synchronization signals are fed out from a synchronization master into the ring structure in opposite directions relative to one another.

A memory (also called a cache in the following) can be designed so that commands are sent to the autonomous components in the order in which they should be executed (also called "FIFO" in the following) or commands are sent to the autonomous components independent of the order in which they should be executed, wherein the commands are written into a memory in the order of their command execution time specification, or commands are stored in a memory, wherein command execution time specifications regarding commands in a CAM ("content addressable memory"=CAM) are stored with the same address, wherein if the clock time (time) of a clock coincides with an arbitrary execution time stored in the CAM, the corresponding address is output from the CAM and is placed at the read port of the command memory that addresses the command selected for execution (also called "cache" in the following).

The time-controlled execution of stored commands can ensue so that the time information of the first command stored in FIFO is compared with the current clock time of a local clock, and the command is executed at the moment in which both items of information coincide (also called "triggered command execution" in the following), or the commands are stored in a command memory, sorted according to their execution time, wherein the read addresses are stored sequentially in the command memory, wherein a command is respectively executed with a time stamp (or command execution time specification) corresponding to an applied read address, or a CAM with time information is supplied with the current time information of a local clock, wherein if the CAM registers an agreement of the time information with a command execution time specification, the command corresponding to the command execution time specification is executed.

According to an embodiment of the invention, commands are transferred via a ring structure from a central controller to the components, in particular in that at least two synchronization signals are sent from the central controller in the direction of different components in the ring structure.

In another embodiment of the invention, a point in time that is identical for all clocks is advantageously determined as follows as a central point in time between the reception of two synchronization signals in the components:

The local clocks are reset to a start point in time with the receipt or decoding of the first synchronization signal. Upon the receipt or decoding of the second synchronization pulse in a component, in the component the local clock time is halved in the clock thereof. If the two synchronization pulses are propagated through a ring structure to the central controller, the central controller also sets its clock to the median between transmission and reception of the two synchronization pulses.

The invention can be implemented in an imaging system that is a magnetic resonance tomography system or a computed tomography system, or an AX system.

DESCRIPTION OF THE PREFERRED EMBODIMENTS

Figure 1:
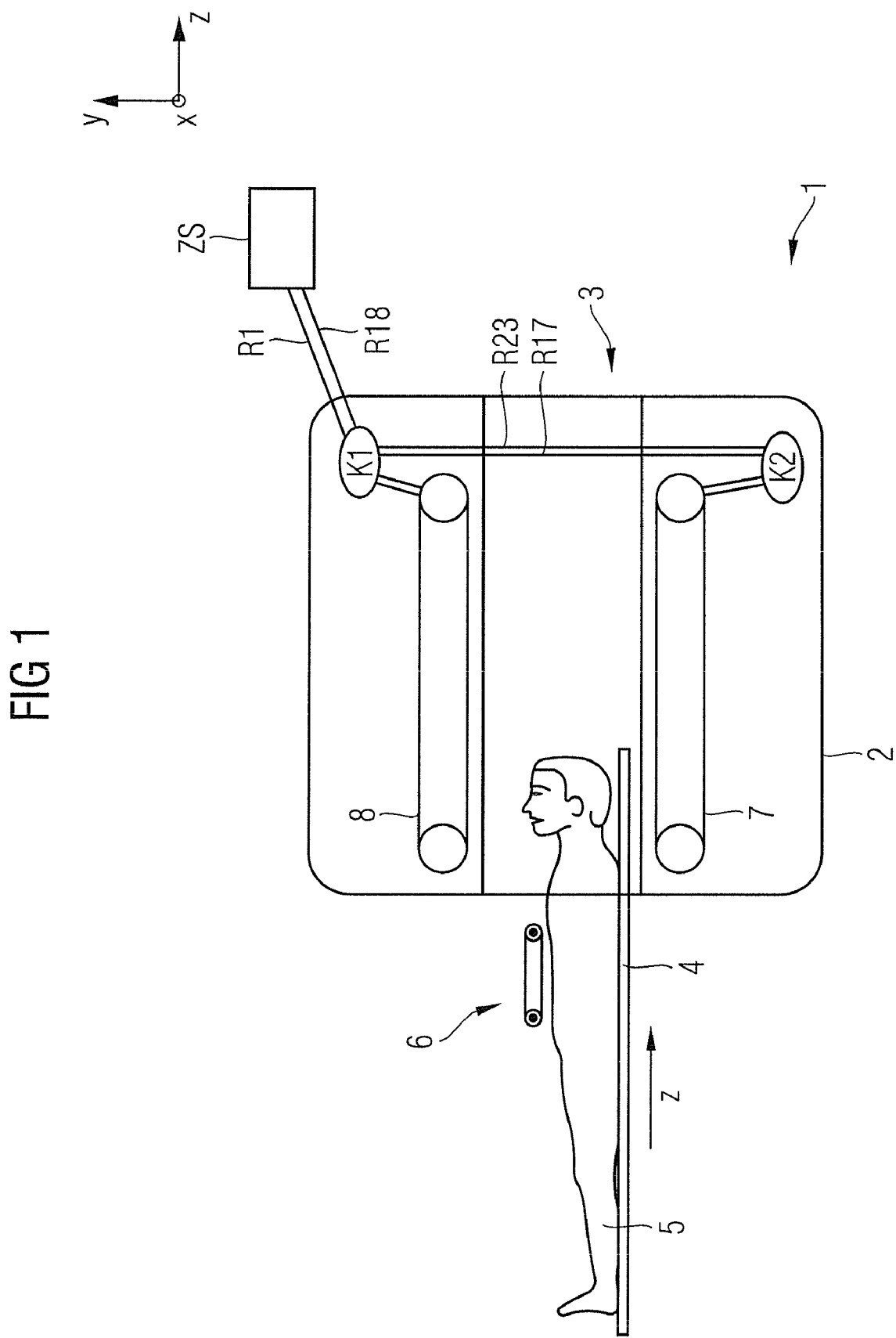
FIG. 1 schematically shows an MRT whole-body coil.

FIG. 1 shows a magnetic resonance apparatus MRT 1 with a whole-body coil 2 with a tube-shaped chamber 3 into which a patient bed 4 (for example with a patient 5 and a local coil arrangement 6) can be driven in the direction of an arrow z in order to then generate exposures of the patient 5. A local coil array 6 is placed on the patient, with which exposures are enabled in a local region and whose signals can be evaluated (converted into images etc.) by a known evaluation device that can be connected via coaxial cables etc. Gradient coils 7, 8 that generate gradient fields are provided as exemplary additional components. In local components such as transmitters or receivers (6, 7, 8) for RF pulses and/or for gradient pulses and/or other RF signals of the MRT 1, commands that are transferred from a central controller ZS via connections R1, R18, R23, R17 etc. to components 6, 7, 8 are executed at the predetermined point in time (t1, t2) with the aid of synchronized local clocks in the components. The components K1, K2 in FIG. 1 here respectively control at least one element (for instance here the coils 7, 8) according to commands that they (K1, K2) receive from a central controller ZS.

Figure 2:
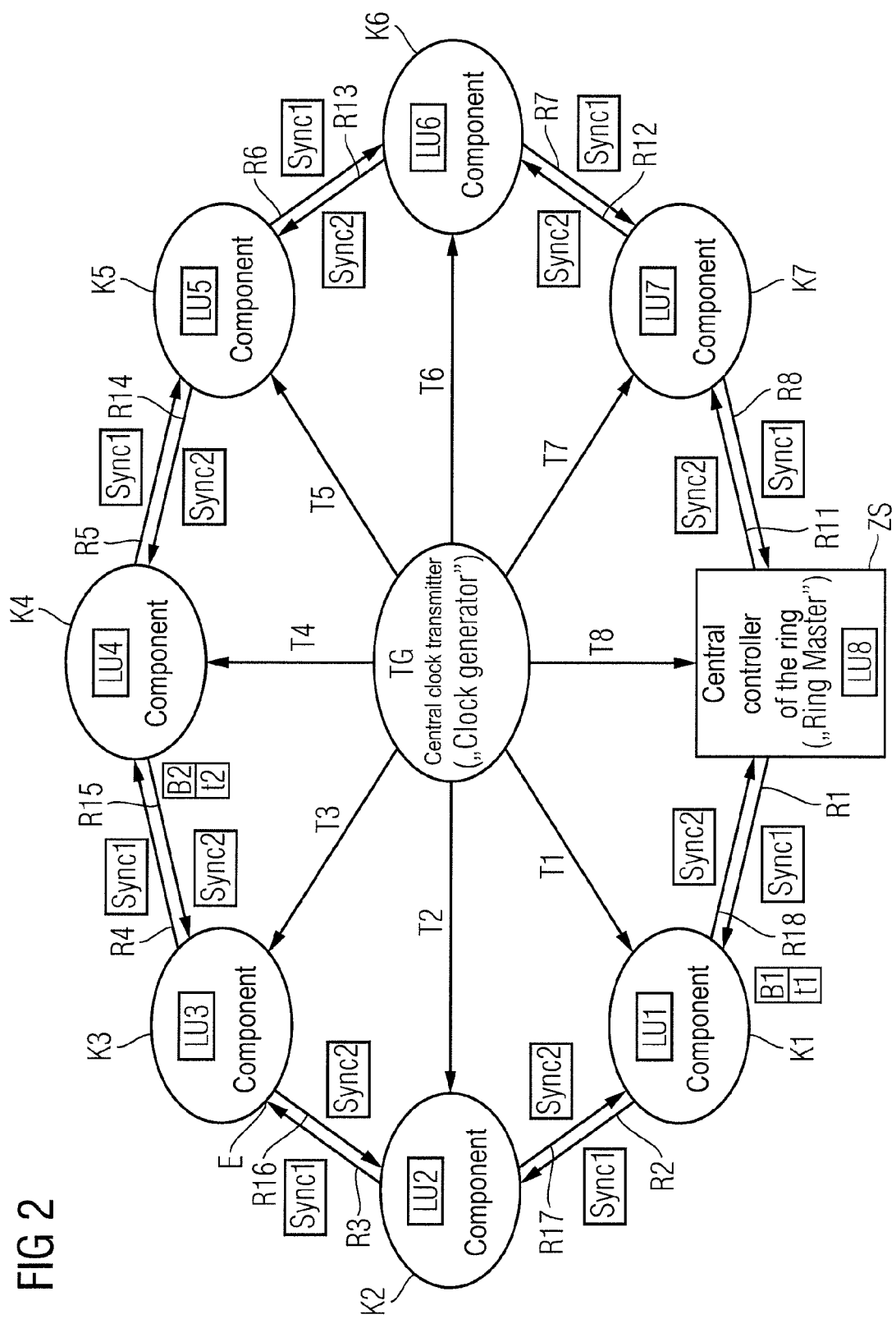
FIG. 2 schematically shows an imaging system with multiple components that are synchronized.

FIG. 2 schematically shows multiple components K1, K2, K3, K4, K5, K6, K7 (for example transmitters or receivers or controllers etc.) of an imaging system 1, wherein a respective local clock LU1, LU2, LU3, LU4, LU5, LU6, LU7 of a component K1, K2, K3, K4, K5, K6, K7 should respectively trigger the execution of commands B1, B2 sent to the component at the respective point in time defined by a command execution time specification t1, t2 (sent with the command, for example).

A central clock generator TG sends clock signals via clock lines T1 through T8 to the components K1 through K7 and the central controller ZS (which sends commands to the components) that, for example, can enable the local clocks to run at identical speed (or, alternatively, the local clocks to run identically quickly with sufficient precision without a central clock).

The controller ZS sends commands B1, B2 to components K1 through K8 via a ring (comprising the ring segments R1, R2, R3, R4, R5, R6, R7, R8, R11, R12, R13, R14, R15, R16, R17, of which two (R1, R18) can be a physical conductor, for example) and, with/regarding the commands B1, B2, sends execution times t1, t2 at which the commands B1, B2 are to be executed by the unit K1, K2 addressed by the command.

For this purpose, the local clocks LU1 through LU7 in the components K1 through K7 are synchronized relative to one another (and also relative to the clock LU8 of the central controller ZS) so that they thus display the same time ("Time") (exhibit or output as "Time") at a point in time and run at the same speed as necessary.

For this the local clocks LU1 through LU8 receive information (Sync1 and Sync2) from the central controller ZS that help them to set their current clock time in sync with one another and the controller ZS at an identical point in time (or, respectively, to actually adjust their clock time to different points in time at different times in FIG. 2, wherein they nevertheless subsequently display the same clock time simultaneously).

In the exemplary embodiment in FIG. 2, this is executed in that the central controller ZS of the ring ("Ring Master") sends signals (Sync1 and Sync2) in two directions via the ring: in FIG. 2 the central controller sends the synchronization signal Sync1 in the clockwise direction via the ring elements R1 through R8 and sends the synchronization signal Sync2 counter-clockwise via the ring elements R11 through R18.

ZS sends the synchronization signal Sync1 via the ring element R1 to the component K1, the component K1 sends the synchronization signal Sync1 via the ring to the component K2, the component K2 sends the synchronization signal Sync1 via the ring to the component K3 etc. until the component K7 or until the controller ZS.

Moreover, ZS sends the synchronization signal Sync2 via the ring R11 to the component K7, the component K7 sends the synchronization signal Sync2 via the ring to the component K6, the component K6 sends the synchronization signal Sync2 via the ring to the component K5 etc. until the component K1 or until the controller ZS.

In all local clocks LU1 through LU8, a point in time that is identical for all clocks is determined here as a middle point in time between two synchronization signals (Sync1 and Sync2) as follows:

the local clocks L1 through L8 are reset to an initial point in time (for example 0:00:00.000000000) with the decoding of the first synchronization signal (Sync1), with the decoding of the second synchronization pulse (Sync2) in a component K7, the local clock time (for example 0:00:00.000000014 in K7) is respectively (for each component) halved in the local clock LU7 of this component (for example to 0:00:00.000000007) and the local clock LU7 of this component is set to this halved point in time (for example to 0:00:00.000000007 in LU7 by K7 upon receipt of Sync2 in K7), and if the two synchronization pulses are propagated completely through a ring structure to all components, the synchronization master ZS also sets its clock LU8 to the middle (for example 0:00:00.000000008) between transmission (for example 0:00:00.000000000) and reception (0:00:00.000000016) of the two synchronization pulses (Sync1 and Sync2) by it (ZS).

The local clocks LU1 through LU7 are then synchronized to one another and to the local clock LU8 of a command-transmitting central controller ZS, thus set to the same point in time. The clocks can then continue to run either with the same, identical time speed or with clock pulses from TG.

Commands B1, B2 and data that are received from the autonomous components K1 through K7 are buffered in a cache up to their actual activation.

In the explained ring-topology synchronization, in which the synchronization signals are fed out from a master in opposite directions into the ring and are relayed in every component with constant (relative to the component) delay; the delays in the conductors and plurality of electrical components are compensated.

As an alternative to the explained ring-topology synchronization, a star-topology synchronization is possible: conductors of identical length are used to every component (for example conductors that are arranged like the conductors T1 . . . T8 in FIG. 2). The length is conformed to the longest conductor. In addition to this the electrical conductors to the surface modules are likewise to be taken into account, as well as the processing time of electrical and optical components. This leads to a structure that must be individually balanced and can only conditionally be extended beyond a pre-established maximum expansion. (For instance, an additionally inserted splitter must be compensated again for all branches running in parallel.)

Figure 3:
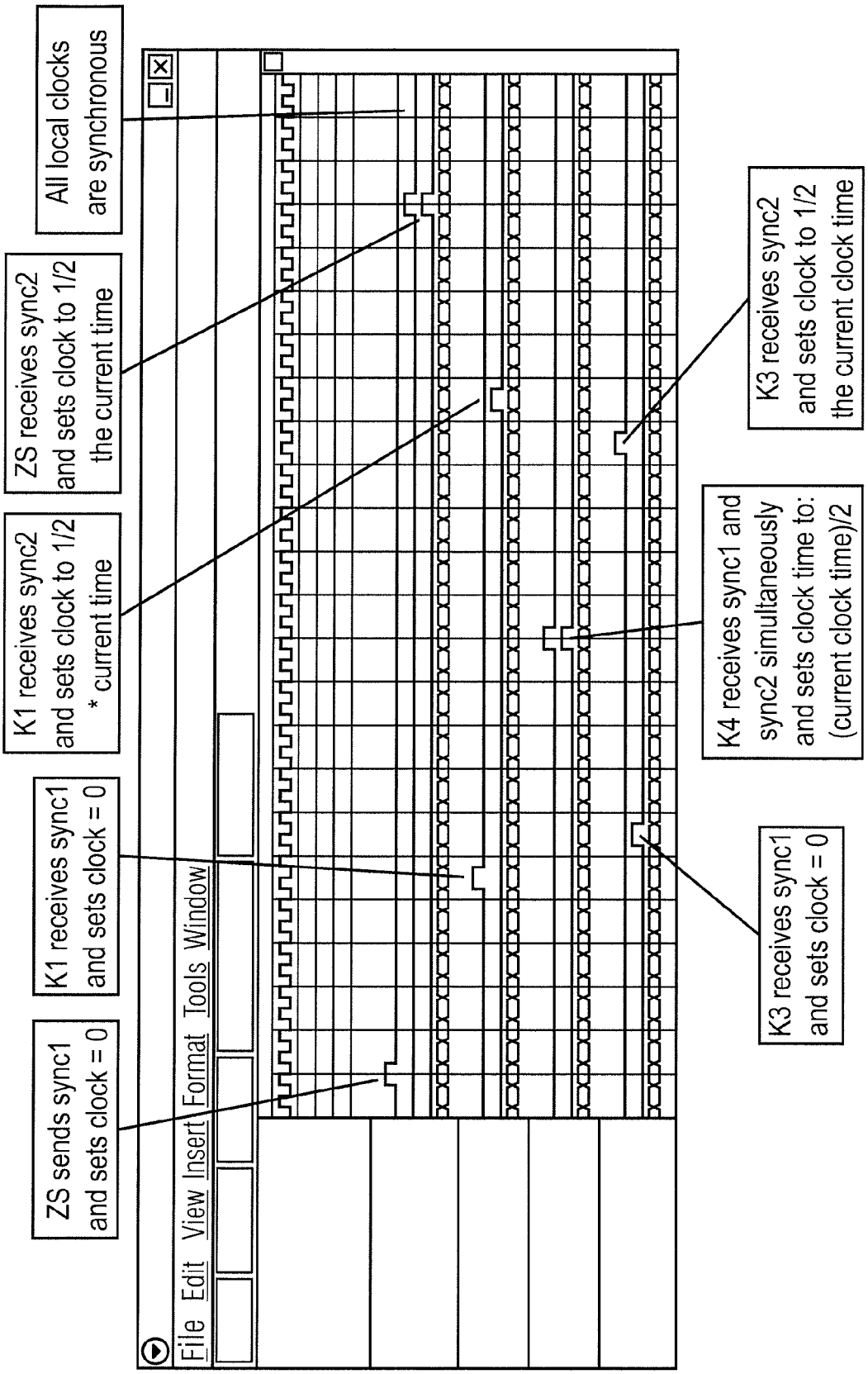
FIG. 3 schematically shows time curves given a time synchronization of local clocks.

FIG. 3 clarifies a few chronological workflows with an oscilloscope image for cables (R1 through R8 and R11 through R18) of identical length between a central controller ZS and the components K1 through K7:

ZS sends Sync1 and sets its clock to 0.
K1 receives Sync1 and sets its clock to 0.
K3 receives Sync1 and sets its clock to 0.
K4 receives Sync2 and sets its clock LU4 to half of the current time in its clock LU4.
K3 receives Sync2 and sets its clock LU4 to half of the current time in its clock LU4.
K3 receives Sync2 and sets its clock LU3 to half of the current time in its clock LU3.
K1 receives Sync2 and sets its clock LU8 to half of the current time in its clock LU1.
ZS receives Sync2 and sets its clock LU8 to half of the current time in its clock LU8.

(The same correspondingly ensues for the additional components and signals.)

All clocks are then synchronized, thus indicate the same time.

This functions in a corresponding manner in cables of different lengths (R1 through R8 and R11 through R18) between a central controller ZS and the components K1 through K7.

Time-controlled execution of the commands:
The implementation of the time-controlled execution of the commands
is dependent on the type of cache (see above).
In an arrangement according to FIG. 4, for example, the time information of the first command is compared in FIFO with the current clock time. At the moment at which both items of information coincide, the command is executed (triggered command execution).
In an arrangement according to FIG. 5, for example, the commands are stored in a command memory, sorted according to execution time, the read addresses are placed sequentially in the command memory. The command belonging to a read address (=corresponding time stamp) is executed.
In an arrangement according to FIG. 6, for example, the CAM is supplied with the time information, for example with the current time information of the clock. If the CAM registers an agreement, the corresponding command is executed. The time controller thus lies in the structure of the distributed command memory and the local clock.

Figure 4:
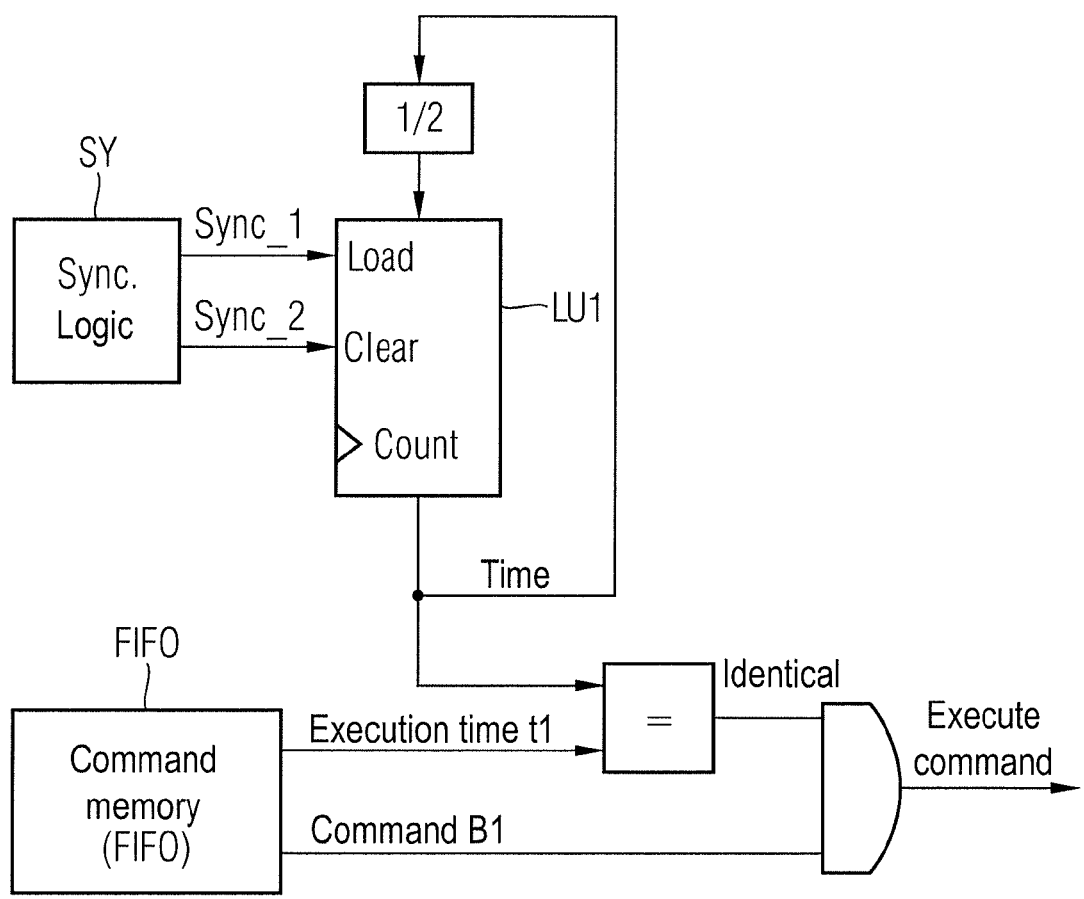
FIG. 4 schematically shows a time synchronization of local clocks and command execution with a FIFO arrangement.

FIG. 4 explains the synchronization of local clocks LU2 through LU7 of components K1 through K7 using each respective FIFO memory to decode the time information t1 of the first command B1 in each of the components K1 through K7.

The system ZS that generates the commands B1, B2 and sends these to the component K1 hereby implements this in a temporally monotonic order. Here the time information at the end of the buffer is decoded (upon readout). However, only one command can thereby ever be checked for a matching execution time. Moreover, a "deadlock" can occur if the time of the first command that is planned for execution is already past.

If the signal Sync1 arrives at a component in a synchronization logic SY (for example a receiver interface) of a component, the clock LU1 is set to zero via the "clear" (=wipe) input; when the signal Sync2 arrives, the clock LU1 is halved to the current clock time "Time" that is output by the local clock LU1 in a halver [sic?] "½" so that the local clock LU1 now keeps this (halved) current time. The resolution of the clock is determined by the required time resolution of the commands to be executed and can be 25 ns (1/40MHz), for example.

Figure 5:
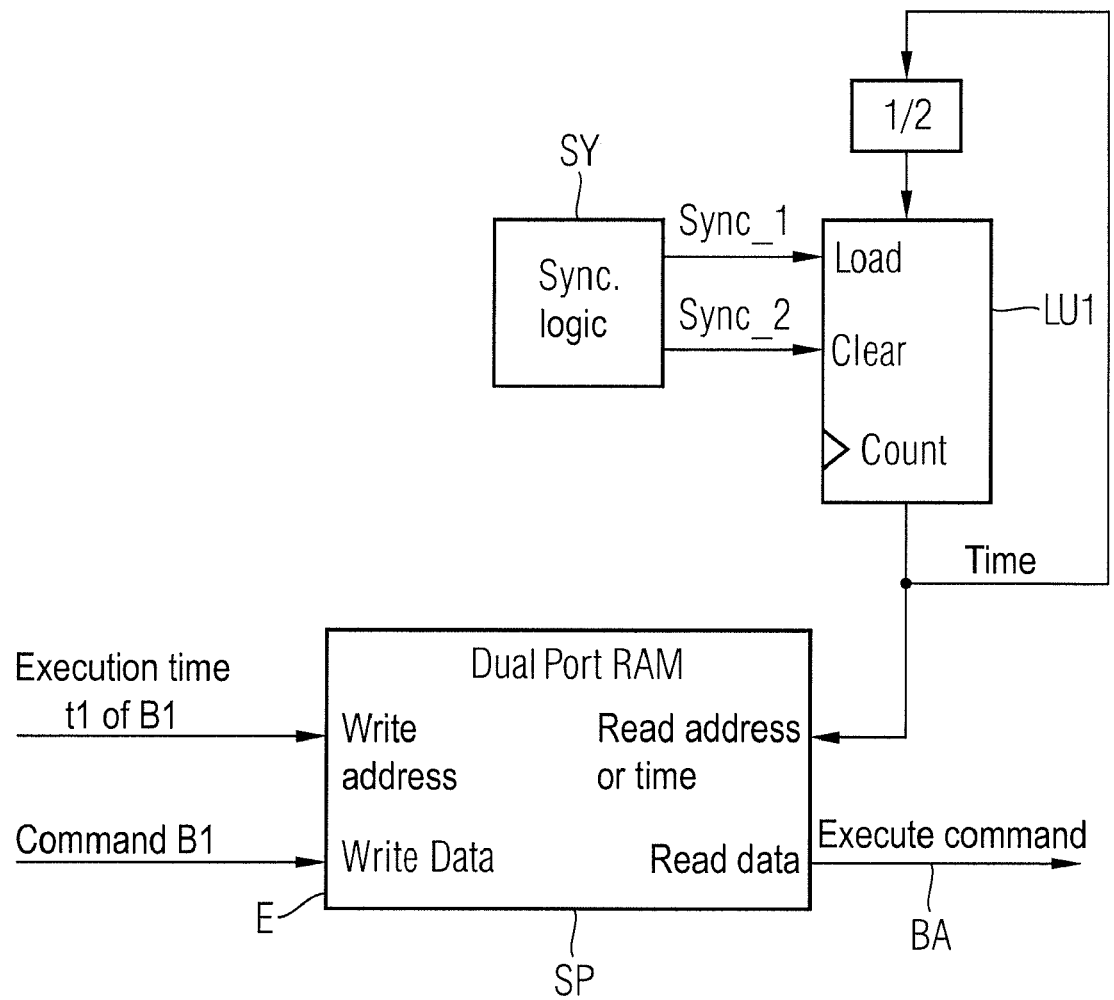
FIG. 5 schematically shows a time synchronization of local clocks and command execution with an additional arrangement.

FIG. 5 shows a command memory with selective write address and time-synchronized read address: the commands B1, B2 are thereby written depending on their execution point in time t1, t2 in a memory SP in which a point in time is associated with every (memory address). The time information is thus decoded upon writing the buffer.

It is not necessary for the commands and data to be received in a temporally monotonic order. Unused memory points (time stamps) must be erased. A deadlock (standstill/block) as in FIG. 4 cannot occur here.

A suboptimal utilization of the command memory and the necessity to erase the entire command memory is somewhat disadvantageous.

Figure 6:
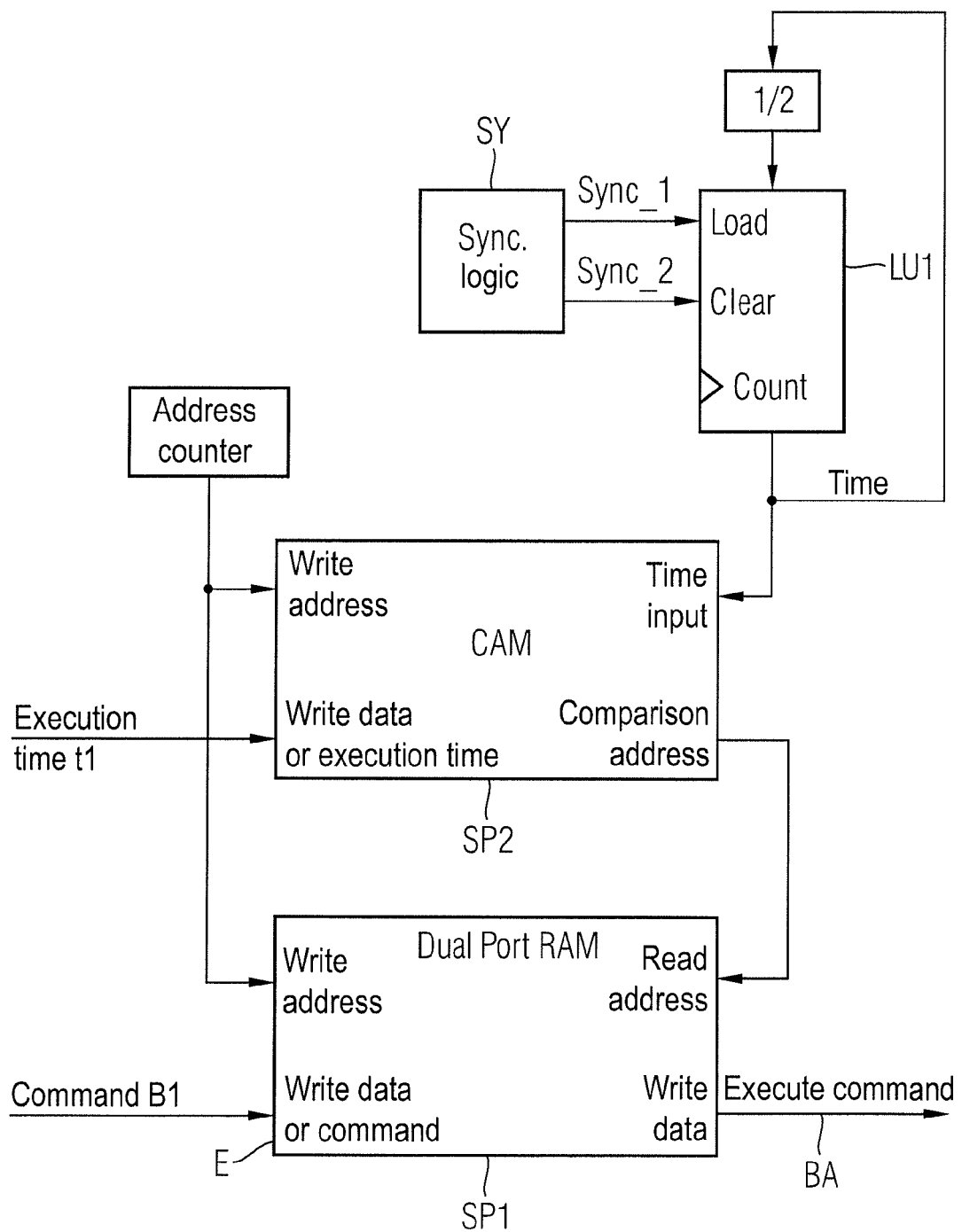
FIG. 6 schematically shows a time synchronization of local clocks and command execution with an additional arrangement.

FIG. 6 shows a command memory with associated read address (cache principle). Commands and read address are stored in two memories; commands are stored in a conventional memory SP1; the time information is stored at the same address in a "content addressable memory" CAM (SP2).

If the clock time ("Time") of the local clock LU1 now agrees with an arbitrary execution time t1 stored in the CAM, the address corresponding to the stored execution time t1 is thus output by the CAM and placed at the read port of the command memory SP. This addresses the command B1 that is therefore selected for execution. The advantage here is the excellent utilization of the memory and that the commands do not need to be received in a temporally monotonic order. A deadlock (standstill) as in theory in FIG. 4 can also not occur here.

The clocks of all components are thus synchronized via a suitable synchronization such that all clocks run together with reproducible phase (relative precision) and locally indicate the same clock time (absolute precision).

Although modifications and changes may be suggested by those skilled in the art, it is the intention of the inventor to embody within the patent warranted hereon all changes and modifications as reasonably and properly come within the scope of his contribution to the art.

We claim as our invention:

1. A method for executing commands in components of an imaging system, each of said components comprising a local clock, said method comprising the steps of:
  temporally synchronizing the respective local clocks of said components in said imaging system;
  transmitting commands to the respective components and including in the respective commands a command execution time specification that specifies a point in time at which the command should be executed that includes the respective command execution time specification;
  receiving the respective commands at the respective components and storing the respective received commands at the respective components, as stored commands;

at each component, automatically retrieving and executing a stored command when a point in time at the local clock at that component coincides with the command execution time specification of the stored command; and transmitting said commands, including said command execution time specification, from a synchronization master to the respective local clocks, the respective transmissions from the synchronization master to the respective local clocks each having a signal delay associated therewith, and automatically taking said signal delay into account when temporally synchronizing the respective local clocks.

2. A method as claimed in claim 1 comprising selecting said components from the group consisting of transmitters in said imaging system and receivers in said imaging system.

3. A method as claimed in claim 1 wherein said commands have a time resolution associated therewith, and comprising providing the respective local clocks with a local clock time resolution sufficient to execute the respective commands according to the time resolution of the commands.

4. A method as claimed in claim 1 comprising temporally synchronizing said local clocks with a reproducible phase that causes all of the local clocks to indicate an identical clock time, by synchronizing said local clocks with each other or by synchronizing said local clocks with a reference clock.

5. A method as claimed in claim 1 comprising temporally synchronizing the respective local clocks by placing the respective local clocks in communication with a common system clock.

6. A method as claimed in claim 1 comprising temporally synchronizing the respective local clocks by providing a transmission clock in a data stream transmitted to the respective components.

7. A method as claimed in claim 1 comprising transmitting said commands, including said command execution time specification to each component from a central controller via respective transmission paths of identical lengths.

8. A method as claimed in claim 7 comprising taking the respective identical lengths of said transmission paths into account when temporally synchronizing the respective local clocks.

9. A method as claimed in claim 1 comprising transmitting said commands to the respective components in a sequence in which the respective commands are to be executed.

10. A method as claimed in claim 1 comprising employing, as said components of said imaging system, components selected from the group consisting of components of a magnetic resonance tomography system, components of a computed tomography system, and components of an AX system.

11. A method as claimed in claim 1 comprising physically spatially separating the respective components in said imaging system.

12. A method for executing commands in components of an imaging system, each of said components comprising a local clock, said method comprising:
    transmitting commands to the respective components and including in the respective commands a command execution time specification that specifies a point in time at which the command should be executed that includes the respective command execution time specification;
    receiving the respective commands at the respective components and storing the respective received commands at the respective components, as stored commands;
    at each component, automatically retrieving and executing a stored command when a point in time at the local clock at that component coincides with the command execution time specification of the stored command; and
    transmitting said commands, including said command execution time specification, via a ring-shaped transmission structure, to which the respective components are connected, from a central controller by transmitting two synchronization signals from said central controller in opposite directions via said ring-shaped transmission structure.

13. A method as claimed in claim 12 comprising defining an identical point in time for all of said local clocks as a middle point in time between respective receipt of said two synchronization signals at each component, by:
    upon receipt of a first of said two synchronization signals at each component, resetting the local clock thereof to a starting point in time;
    upon receipt of a second of said two synchronization signals by each local component, halving the local clock in that component; and
    at said central controller, setting a master clock to a middle point in time between transmission and reception of said two synchronization pulses to and by said controller.

14. A method for executing commands in components of an imaging system, each of said components comprising a local clock, said method comprising:
    temporally synchronizing the respective local clocks of said components in said imaging system;
    transmitting commands to the respective components and including in the respective commands a command execution time specification that specifies a point in time at which the command should be executed that includes the respective command execution time specification;
    receiving the respective commands at the respective components and storing the respective received commands at the respective components, as stored commands
    at each component, automatically retrieving and executing a stored command when a point in time at the local clock at that component coincides with the command execution time specification of the stored command; and
    transmitting said commands to the respective components independently of a sequence in which the commands are to be executed.

15. A method for executing commands in components of an imaging system, each of said components comprising a local clock, said method comprising:
    temporally synchronizing the respective local clocks of said components in said imaging system;
    transmitting commands to the respective components and including in the respective commands a command execution time specification that specifies a point in time at which the command should be executed that includes the respective command execution time specification;
    receiving the respective commands at the respective components and storing the respective received commands at the respective components, as stored commands;
    at each component, automatically retrieving and executing a stored command when a point in time at the local clock at that component coincides with the command execution time specification of the stored command;
    at each component, storing the commands in a first memory at respective command addresses in said first memory;
    for the respective commands stored in said first memory, storing the respective command execution time specifications thereof in a second memory at respective command execution time specification addresses in said second memory that coincide with the respective command addresses in said first memory; and when the clock time at the local clock at said component coincides with any of the respective command execution time specifications stored in said second memory, outputting the command execution time specification address thereof from said second memory to a processor at said component and, from said processor, then retrieving the command from said first memory at the command address in said first memory that coincides with the command execution time specification address output from said second memory.

16. A method for executing commands in components of an imaging system, each of said components comprising a local clock, said method comprising:
temporally synchronizing the respective local clocks of said components in said imaging system;
transmitting commands to the respective components and including in the respective commands a command execution time specification that specifies a point in time at which the command should be executed that includes the respective command execution time specification;
receiving the respective commands at the respective components and storing the respective received commands at the respective components, as stored commands;
at each component, automatically retrieving and executing a stored command when a point in time at the local clock at that component coincides with the command execution time specification of the stored command; and
at each component, storing said commands in a FIFO memory, and comparing the command execution time specification of a first command stored in said FIFO memory with a current clock time of the local clock at that component, and executing said first command when the command execution time specification thereof coincides with said current clock time.

17. A method for executing commands in components of an imaging system, each of said components comprising a local clock, said method comprising:
temporally synchronizing the respective local clocks of said components in said imaging system;
transmitting commands to the respective components and including in the respective commands a command execution time specification that specifies a point in time at which the command should be executed that includes the respective command execution time specification;
receiving the respective commands at the respective components and storing the respective received commands at the respective components, as stored commands;
at each component, automatically retrieving and executing a stored command when a point in time at the local clock at that component coincides with the command execution time specification of the stored command; and
at each component, storing said commands in a command memory, sorted according to the respective command execution time specifications thereof, in sequential read addresses, and executing said commands by reading the respective commands from said command memory at said read addresses.

18. A method as claimed in claim 17 comprising reading a command from the respective read address thereof when the current time of the local clock at that component coincides with the command execution specification time of the command.

19. An imaging system comprising:
a plurality of components that respectively control operation of respective units that collectively operate to generate a medical image, each of said components comprising a local clock, a component processor, and a memory;
a computerized controller configured to temporally synchronize the respective local clocks of said components in said imaging system, by transmitting commands to the respective component processors and including in the respective commands a command execution time specification that specifies a point in time at which the command should be executed that includes the respective command execution time specification;
each component processor being configured to receive the respective commands transmitted thereto and to store the respective received commands in the memory at that component, as stored commands;
each component processor being configured to automatically retrieve and execute a stored command when a point in time at the local clock at that component coincides with the command execution time specification of the stored command; and
said controller being a synchronization master configured to transmit said commands, including said command execution time specification, to the respective local clocks, the respective transmissions from the synchronization master to the respective local clocks each having a signal delay associated therewith, and the respective component processors being configured to automatically take said signal delay into account when temporally synchronizing the respective local clocks.

20. An imaging system as claimed in claim 19 wherein said components are selected from the group consisting of transmitters in said imaging system and receivers in said imaging system.

21. An imaging system as claimed in claim 19 wherein said commands have a time resolution associated therewith, and wherein the respective local clocks are configured with a local clock time resolution sufficient to execute the respective commands according to the time resolution of the commands.

22. An imaging system as claimed in claim 19 wherein said local clocks are temporally synchronized with a reproducible phase that causes all of the local clocks to indicate an identical clock time, by said local clocks being configured to synchronize with each other or by said controller being configured to synchronize said local clocks with a reference clock.

23. An imaging system as claimed in claim 19 wherein said controller is configured to temporally synchronize the respective local clocks by placing the respective local clocks in communication with a common system clock.

24. An imaging system as claimed in claim 19 wherein said controller is configured to temporally synchronize the respective local clocks by providing a transmission clock in a data stream transmitted to the respective components.

25. An imaging system as claimed in claim 19 wherein said controller is configured to transmit said commands, including said command execution time specification to each component from a central location via respective transmission paths of identical lengths.

26. An imaging system as claimed in claim 25 wherein the respective component processors are configured to take the respective identical lengths of said transmission paths into account when temporally synchronizing the respective local clocks.

27. An imaging system as claimed in claim 19 wherein said controller is configured to transmit said commands to the respective components in a sequence in which the respective commands are to be executed.

28. An imaging system as claimed in claim 19 wherein said units are selected from the group consisting of units of a magnetic resonance tomography system, units of a computed tomography system, and units of an AX system.

29. An imaging system as claimed in claim 19 wherein the respective components are physically spatially separate from each other.

30. An imaging system comprising:
a plurality of components that respectively control operation of respective units that collectively operate to generate a medical image, each of said components comprising a local clock, a component processor, and a memory;
a computerized controller configured to temporally synchronize the respective local clocks of said components in said imaging system, by transmitting commands to the respective component processors and including in the respective commands a command execution time specification that specifies a point in time at which the command should be executed that includes the respective command execution time specification;
each component processor being configured to receive the respective commands transmitted thereto and to store the respective received commands in the memory at that component, as stored commands;
each component processor being configured to automatically retrieve and execute a stored command when a point in time at the local clock at that component coincides with the command execution time specification of the stored command;
said controller being a central controller and said components forming a ring-shaped structure, said central controller being configured to transmit two synchronization signals from said central controller in opposite directions via said ring-shaped transmission structure.

31. An imaging system as claimed in claim 30 wherein each component processor is configured to define an identical point in time for all of said local clocks as a middle point in time between respective receipt of said two synchronization signals at each component, by:
upon receipt of a first of said two synchronization signals at each component, resetting the local clock thereof to a starting point in time;
upon receipt of a second of said two synchronization signals by each local component, halving the local clock in that component; and
at said central controller, setting a master clock to a middle point in time between transmission and reception of said two synchronization pulses to and by said controller.

32. An imaging system comprising:
a plurality of components that respectively control operation of respective units that collectively operate to generate a medical image, each of said components comprising a local clock, a component processor, and a memory;
a computerized controller configured to temporally synchronize the respective local clocks of said components in said imaging system, by transmitting commands to the respective component processors and including in the respective commands a command execution time specification that specifies a point in time at which the command should be executed that includes the respective command execution time specification;
each component processor being configured to receive the respective commands transmitted thereto and to store the respective received commands in the memory at that component, as stored commands;
each component processor being configured to automatically retrieve and execute a stored command when a point in time at the local clock at that component coincides with the command execution time specification of the stored command; and
said controller being configured to transmit said commands to the respective components independently of a sequence in which the commands are to be executed.

33. An imaging system comprising:
a plurality of components that respectively control operation of respective units that collectively operate to generate a medical image, each of said components comprising a local clock, a component processor, and a memory;
a computerized controller configured to temporally synchronize the respective local clocks of said components in said imaging system, by transmitting commands to the respective component processors and including in the respective commands a command execution time specification that specifies a point in time at which the command should be executed that includes the respective command execution time specification;
each component processor being configured to receive the respective commands transmitted thereto and to store the respective received commands in the memory at that component, as stored commands;
each component processor being configured to automatically retrieve and execute a stored command when a point in time at the local clock at that component coincides with the command execution time specification of the stored command; and
each memory comprising a first memory and a second memory and each component processor being configured to:
store the commands in the first memory at respective command addresses in said first memory;
for the respective commands stored in said first memory, store the respective command execution time specifications thereof in the second memory at respective command execution time specification addresses in said second memory that coincide with the respective command addresses in said first memory; and
when the clock time at the local clock at said component coincides with any of the respective command execution time specifications stored in said second memory, retrieve the command execution time specification address thereof from said second memory to then retrieve the command from said first memory at the command address in said first memory that coincides with the command execution time specification address output from said second memory.

34. An imaging system comprising:
a plurality of components that respectively control operation of respective units that collectively operate to generate a medical image, each of said components comprising a local clock, a component processor, and a memory;
a computerized controller configured to temporally synchronize the respective local clocks of said components in said imaging system, by transmitting commands to the respective component processors and including in the respective commands a command execution time specification that specifies a point in time at which the command should be executed that includes the respective command execution time specification;
each component processor being configured to receive the respective commands transmitted thereto and to store the respective received commands in the memory at that component, as stored commands;

each component configured retrieve and execute a stored command when a point in time at the local clock at that component coincides with the command execution time specification of the stored command; and each memory being a FIFO memory, and each component processor being configured to compare the command execution time specification of a first command stored in said FIFO memory with a current clock time of the local clock at that component, and to execute said first command when the command execution time specification thereof coincides with said current clock time.

35. An imaging system comprising:

a plurality of components that respectively control operation of respective units that collectively operate to generate a medical image, each of said components comprising a local clock, a component processor, and a memory;

a computerized controller configured to temporally synchronize the respective local clocks of said components in said imaging system, by transmitting commands to the respective component processors and including in the respective commands a command execution time specification that specifies a point in time at which the command should be executed that includes the respective command execution time specification;

each component processor being configured to receive the respective commands transmitted thereto and to store the respective received commands in the memory at that component, as stored commands;

each component processor being configured to automatically retrieve and execute a stored command when a point in time at the local clock at that component coincides with the command execution time specification of the stored command; and each component being configured to store said commands in the memory, sorted according to the respective command execution time specifications thereof, in sequential read addresses, and to execute said commands by reading the respective commands from said memory at said read addresses.

36. An imaging system as claimed in claim 35 wherein each component processor is configured to read a command from the respective read address thereof when the current time of the local clock at that component coincides with the command execution specification time of the command.

* * * * *